(12) United States Patent
Lee

(10) Patent No.: US 6,222,894 B1
(45) Date of Patent: Apr. 24, 2001

(54) DIGITAL DELAY LOCKED LOOP FOR REDUCING POWER CONSUMPTION OF SYNCHRONOUS SEMICONDUCTOR MEMORY DEVICE

(75) Inventor: Sung-Geun Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 08/990,486

(22) Filed: Dec. 18, 1997

(30) Foreign Application Priority Data

Dec. 18, 1996 (KR) .................................................. 96-67415
Dec. 18, 1996 (KR) .................................................. 96-67416

(51) Int. Cl.$^7$ ................................. H03K 5/14; H03K 5/15
(52) U.S. Cl. ........................... 375/376; 327/142; 327/153; 327/161
(58) Field of Search ..................................... 375/359, 371, 375/373, 376; 327/141, 142, 152, 153, 158, 159, 161, 277, 284

(56) References Cited

U.S. PATENT DOCUMENTS

| | | | |
|---|---|---|---|
| 5,875,219 | * | 2/1999 | Kim ..................................... 375/376 |
| 5,901,190 | * | 5/1999 | Lee ..................................... 375/373 |
| 5,935,257 | * | 8/1999 | Nishimura ............................ 713/503 |
| 6,018,259 | * | 1/2000 | Lee ..................................... 327/159 |
| 6,037,812 | * | 3/2000 | Gaudet ................................. 327/116 |
| 6,037,813 | * | 3/2000 | Eto et al. .............................. 327/156 |

* cited by examiner

Primary Examiner—Young T. Tse
(74) Attorney, Agent, or Firm—Margen Johnson & McCollom, P.C.

(57) ABSTRACT

A digital delay locked loop for a synchronous semiconductor memory device reduces power consumption by disabling the stages of the delay locked loop that are not required for generating an internal clock signal that is synchronized with an external system clock signal. The delay locked loop includes a first synchronous delay line formed from a plurality of serially connected unit delayers, a second synchronous delay line formed from a second plurality of serially connected unit delayers, a plurality of phase detectors arranged in successive order to compare the external clock signal to the plurality of delayed clock signals and generate a plurality of enable signals, and a plurality of switches arranged in successive order to select a delayed clock signal from the second delay line as an internal clock signal. Each stage includes one of the unit delayers in the first delay line, one of the unit delayers in the second delay line, one of the phase detectors, and one of the switches. Each of the phase detectors generates a carry signal if the clock signal from its stage is synchronized with the system clock or if it is downstream from the stage that is synchronized. The carry signal from each stage is coupled to the next successive stage. Each of the stages has one or more operation cutting circuits to disable the stage responsive to an active carry signal from the previous stage. The operation cutting circuits can be included in the phase detectors and the unit delayers in each stage to disable inverters in the unit delayers and latches in the phase detectors to conserve power in stages that are not necessary for generating the internal clock signal.

14 Claims, 8 Drawing Sheets

DIGITAL DELAY LOCKED LOOP FOR REDUCING POWER CONSUMPTION OF SYNCHRONOUS SEMICONDUCTOR MEMORY DEVICE

This application corresponds to Korean patent applications No. 96-67415 and 96-67416, both filed Dec. 18, 1996 in the name of Samsung Electronics Co., Ltd. which are herein incorporated by reference for all purposes.

BACKGROUND OF THE INVENTION

1. Field of the Invention

This invention relates generally to synchronous semiconductor memory devices driven in response to exterior system clocks, and more particularly, to digital delay locked loops which can reduce the power consumption of such synchronous semiconductor memory devices.

2. Description of the Related Art

A synchronous semiconductor memory device typically has a buffer for receiving an exterior system clock and generating an internal clock which is used in the interior of the chip to perform high-speed operations. Therefore, each device within the chip that receives the output from the buffer operates in synchronization with the system clock. However, since the buffer delays the system clock, a phase difference occurs between the external system clock and the internal clock. That is, the operation of the interior of the chip is delayed with respect to the external clock by this phase difference. Therefore, efforts have been made to devise a technique for operating the internal clock in complete synchronization with the external system clock.

One prior art method for eliminating the phase delay uses a phase locked loop (PLL), a delay locked loop (DLL), or other similar device to minimize the skew between the external system clock and the internal clock. However, this technique is not suitable for use with high-speed synchronous DRAM (Dynamic Random Access Memory) devices due to the long locking time for phase synchronization. This technique also increases the standby current consumed by the device while it is in a standby state. Furthermore, there are difficulties in operating a PLL or DLL at specific frequencies.

FIG. 1 shows another prior art scheme for reducing the skew between the external system clock and the internal clock in which a digital delay locked loop using a synchronous delay line (SDL) generates an internal clock which is accurately synchronized with the external system clock.

Referring to FIG. 1, a delay buffer BDC delays an external system clock CLK. A first clock PCLK_M generated by the delay buffer BDC is connected to the input node of a main delayer MDC, the input nodes of a plurality of phase delay detectors DDC1–DDCn, and the input node of a second synchronous delay line consisting of a plurality of unit delayers BUD1–BUDn. The output node of the main delayer MDC is connected to a plurality of unit delayers FUD1–FUDn each having the same delay length. The plurality of unit delayers FUD1–FUDn are connected to each other in series and form a first synchronous delay line. The plurality of unit delayers FUD1–FUDn within the first synchronous delay line delays a second clock D1, which is output from the main delayer MDC, and generates delayed clocks D2–Dn.

In the second synchronous delay line, the unit delayers BUD1–BUDn each have the same delay length as the unit delayers FUDi, where i=1 . . . n, and are serially connected. Switches SWC1–SWCn are connected between the input and output nodes of the unit delayers BUD1–BUDn and are arranged to selectively supply either the first clock PCLK_M or one of the a delayed clocks D2'–Dn' to an output node as the internal clock signal PCLK in response to the activation one of a plurality of enable signals Fi which are output by the phase delay detectors DDCi where i=1 . . . n. The switches SWC1–SWCn receive, through their respective input terminals, the first clock PCLK_M and the delayed clocks Di' generated by the unit delayers BUD1–BUDn of the second synchronous delay line, and are individually enabled by the activation of output signals from the phase delay detectors DDC1–DDCn. The phase delay detectors DDC1–DDCn latch the delayed clocks D1–Dn when the first clock PCLK_M switches to logic "LOW" and activate the enable signal Fi when PCLK_M is phase-synchronized with the delayed clock Di.

An example of the operation of FIG. 1 will now be described with reference to FIG. 2 which is a timing chart showing waveforms of various signals in the circuit of FIG. 1. If the external system clock CLK shown in FIG. 2 is applied, the delay buffer BDC generates the first clock PCLK_M which is delayed and level-converted to a clock pulse shown in FIG. 2. The first clock PCLK_M is delayed by the main delay MDC having a delay length corresponding to the delay length of the delay buffer BDC and generated as the second clock D1. Moreover, the first clock PCLK_M generated by the delay buffer BDC is simultaneously supplied to the first input nodes of each of the phase delay detectors DDC1–DDCn and to the unit delayer BUD1 of the second synchronous delay line. The second clock D1 is sequentially delayed by the unit delayers FUD1–FUDn of the first synchronous delay line, which are serially connected to the output node of the main delayer MDC, and generated as delayed clocks D2–Dn. Each of the unit delayers FUD1–FUDn has the same delay length. The second clock D1 generated by the main delayer MDC and the delayed clocks D2–Dn are supplied to the second input nodes of each of the phase delay detectors DDC1–DDCn.

The phase delay detector DDC1 compares the phase of the first clock PCLK_M generated by the delay buffer BDC with the phase of the second clock D1 generated by the main delayer MDC. Other phase delay detectors DDC2–DDCn compare the phase of the first clock PCLK_M generated by the delay buffer BDC with the phase of each of the delayed clocks D2–Dn generated at respective output nodes of the unit delayers FUD1–FUDn of the first synchronous delay line. The phase delay detectors DDC1–DDCn activate the enable signal Fi that has the same period as the delayed clock Di when the two clocks are phase-synchronized.

For example, if the first clock PCLK_M has the same phase as a delayed clock D12 generated by unit delayer FUD12, phase delay detector DDC12 latches the delayed clock D12 and generates an enable signal during a logic "LOW" interval of the first clock PCLK_M. That is, the phase delay detector DDC12 activates the output signal F12 as indicated by waveform F12 shown in FIG. 2. Therefore, switch SWC12, which has a control terminal connected to the output node of the phase delay detector DDC12, is turned on, and a clock D12' sequentially delayed by the unit delayers BUD1–BUD11 is connected to the output node of the internal clock PCLK. In other words, by enabling the signal F12 from the phase delay detector DDC12, the circuit of FIG. 1 generates the internal clock from the output D12' by delaying the first clock PCLK_M through the unit delayers BUD1–BUD11. In this case, the internal clock PCLK has no delay generated by the main delayer MDC.

The internal clock PCLK generated by the above-described operation is generated with the same phase as the external system clock CLK without any delay after two periods of the external system clock CLK. Since it takes a short time to equalize the phase between the external system clock CLK and the internal clock PCLK, the performance of a synchronous memory device can be improved by using a digital delay locked loop that has a synchronous delay line as shown in FIG. 1.

The detailed construction of the digital delay locked loop of FIG. 1 will now be described with reference to FIG. 3 so that the preferred embodiments of the present invention, which will be described later on, can be more fully understood. FIG. 3 is a circuit diagram showing more details of the unit delayers FUDD1–FUDn and BUD1–BUDn constituting the first and second synchronous delay lines, the switches SWC1–SWCn, the phase delay detectors DDC2–DDCn, and the mutual connection relationship therebetween, of the digital delay locked loop of FIG. 1.

The delay buffer BDC indicated in FIG. 1 is not shown in FIG. 3. Also, the phase delay detector DDC1 for receiving the second clock D1 generated by the main delayer MDC is also shown. Instead of the phase delay detector DDC1, a bypass circuit BP is included in order to accommodate situations in which the synchronization through the synchronous delay line is not correct. The bypass circuit BP receives a carry output from the phase delay detector DDCn, and if the period of the external system clock CLK is longer than the delay time of the synchronous delay line, the bypass circuit BP bypasses the first clock PCLK_M directly to the internal clock PCLK by the operation of switch SWC1.

An internal delayer ID having two inverters connected in series is included as a final output stage in order to accurately detect the level and output time of the internal clock PCLK. The phase delay detectors DDC2–DDCn have the same internal construction and consist of transmission switches S1 and S2 coupled by a PMOS transistor and an NMOS transistor, inverters I1 and I2 arranged to form a latch, inverters I3 and I4 arranged to form a latch, inverters I5 and I6, and NAND gates N1 and N2.

FIG. 4 is a timing chart illustrating the operation of the circuit of FIG. 3. When the external system clock CLK is applied, the first clock PCLK_M delayed by the delay buffer BDC appears at an input node N1. The main delay MDC delays the first clock PCLK_M by the delay length produced by four inverters and generates the second clock D1. The first clock PCLK_M is sequentially delayed by the serially connected unit delayers BUD1–BUDn of the second synchronous delay line, and the delayed clocks D2'–Dn' are generated at the respective output nodes of the unit delayers BUD1–BUDn, as shown in FIG. 4. The delayed clocks D1'–Dn' are advanced relative to the clocks D1–Dn by the delay length of the main delayer MDC. When one of the enable signals is activated, one of the switches SWC1–SWCn is turned on, thereby selecting only one of the delayed clocks D1'–Dn' to be provided as the internal clock PCLK.

The second clock D1 generated by the main delayer MDC is sequentially delayed by the unit delayers FUD1–FUDn, each of which has two inverters serially connected and which generate the delayed clocks D2–D14 as shown in FIG. 4. The clocks D2–Dn generated at the output nodes of the unit delays FUD1–FUDn are supplied to each transmission switch S1 of the phase delay detectors DDC2–DDCn. Each transmission switch S1 within the phase delay detectors DDC2–DDCn includes one NMOS transistor and one PMOS transistor coupled like a typical transmission gate. The gate of the NMOS transistor of the transmission switch S1 is connected to the first clock PCLK_M, and the gate of the PMOS transistor of the transmission switch S1 is connected to an output node of an inverter INT for inverting the first clock PCLK_M. Each output node of each transmission switch S1 within the phase delay detectors DDC2–DDCn is connected to an input node of an inversion latch circuit consisting of the inverters I1, I2 and I5 for latching an input signal. If the first clock PCLK_M is logic "HIGH", the delayed clocks D2–Dn generated by the unit delayers FUD1–FUDn are latched to an output node of the inversion latch circuit within the phase delay detectors DCC2–DDCn, and the latched signals are output when respective transmission switches S2 are turned on.

The transmission switch S2, which is switched when the first clock PCLK_M is logic "LOW", is connected to the output node of the inversion latch circuit. A latch circuit consisting of inverters I3 and I4 is connected to an output node of the transmission switch S2 for latching an input delayed clock. The output node Li of the latch circuit is connected to one input of a carry generator consisting of NAND gates N1 and N2 and inverter I6.

The carry generator activates the enable signal at the output node Fi only when the carry input terminal Ti and the output node Ni are logic "HIGH" and "LOW", respectively, and simultaneously disables the carry output terminal Ti+1. For instance, if node T3 is logic "HIGH" and node L3 is logic "LOW", the output of the NAND gate N2 is logic "LOW". Since the output node F3 is logic "LOW", switch SWC3 is turned on. The carry output terminal T4 is logic "LOW" and which disables the carry output. If logic levels which are different from the above example are applied to the nodes T3 and L3, the output node Fi is disabled (logic "HIGH"), and the carry output terminal Ti+1 is enabled (logic "HIGH"). If the enable signal generated at the output node F3 is activated, the first clock PCLK_M is synchronized with delayed clock D3 without any phase delay difference.

In FIG. 4, the delayed clock D12 of the first synchronous delay line is shown synchronized with the first clock PCLK_M. Therefore, output node L12 of the latch circuit of DDC12, as well as the corresponding nodes in DDC13, DDC14, etc., generate logic "LOW". Carry output terminals T13, T14, etc., are disabled. Output node F12 is enabled. Then the delayed clock D12' from the second synchronous delay line passes through a the corresponding switch SWC12 and is provided as the internal clock PCLK through the internal delayer ID.

Although the digital delay locked loop of FIG. 3 can generate an internal clock that is accurately synchronized with the system clock, a large quantity of powers is consumed by the synchronous delay lines and the plurality of phase delay detectors.

Accordingly, a need remains for an improved technique for reducing the skew between the external system clock and the internal clock in a synchronous memory device.

SUMMARY OF THE INVENTION

Therefore, it is an object of the present invention to reduce the amount of power required to generate an accurately synchronized internal clock in a synchronous semiconductor memory device.

To accomplish these and other objects, a digital delay locked loop for a synchronous memory device constructed in accordance with the present invention reduces the amount of power required to generate an internal clock by eliminating unnecessary power consumption by the unit delayers and the phase delay detectors in a digital delay locked loop. This unnecessary power consumption can be understood with reference to the prior art digital delay locked loop of FIG. 4. As shown in FIG. 4, after a specific phase delay detector generates the synchronized internal clock by its detecting operation, the unit delayers and the phase delay detectors connected to the next stage still operate. That is, since the inversion latch circuits consisting of the inverters I1, I2 and I5 within each phase delay detector in the next stages perform latching operations on the delayed clocks even after a specific delay detector selects the appropriate delay signal, power is consumed by the next stages. This is apparent from waveforms L13–Ln which are at logic "LOW" as shown in FIG. 4. A synchronous DRAM that obtains an accurate internal clock by using unit delayers as shown in FIG. 3 includes many unit delayers and phase delay detectors. Therefore, a large amount of unnecessary power is consumed within the phase delay detectors.

A digital delay locked loop for a synchronous memory device constructed in accordance with the present invention eliminates this unnecessary power consumption by cutting off the internal operation of phase delay detectors installed at the following stages of a specific phase delay detector after a synchronized internal clock is generated by a detecting operation of the specific delay detector.

A digital delay locked loop in accordance with the present invention also eliminates unnecessary power consumption by cutting off the internal operation of unit delayers within an improved synchronous delay line as well as phase delay detectors installed at the next stages of a specific phase delay detector after a synchronized internal clock is generated by a detecting operation of the specific delay detector of a digital delay locked loop.

One aspect of the present invention is a digital delay locked loop having a plurality of phase delay detectors, each of which includes an operation cutting circuit for cutting off the internal operation of the phase delay detectors installed at the next stage of a specific phase delay detector after the internal clock is generated by a detecting operation of the specific phase delay detector so as to prevent unnecessary power consumption.

Another aspect of the present invention is a digital delay locked loop that includes unit delayers in first and second synchronous delay lines symmetrically installed on the basis of phase delay detectors. Each unit delayer includes a logic gate and an inverter connected to an output of the logic gate. The logic gate has one input connected to an output of the preceding unit delayer and the other input connected to a carry output of a phase delay detector correspondingly connected to a unit delayer positioned before the preceding unit delay. If an internal clock phase-synchronized with a first clock is generated, the delay operation of unit delayers situated at the following states are cut off by the carry output and the operation of phase delay detectors connected to the unit delayers is prevented, thereby reducing unnecessary power consumption.

A further aspect of the preset invention is a method for operating a digital delay locked loop for a synchronous semiconductor memory device, the delay locked loop comprising a plurality of stages arranged in successive order for generating a plurality of delayed clock signals responsive to a system clock, each stage generating one of the plurality of delayed clock signals such that the delayed clock signal from each stage has a different phase delay with respect to the system clock, the method comprising: selecting one of the stages that has a delayed clock signal that is synchronized with the system clock; providing the delayed clock signal from the selected stage as an internal clock; and disabling any stages that are not necessary for generating the selected delayed clock signal, thereby reducing the power consumed by the delay locked loop.

Yet another aspect of the present invention is a digital delay locked loop for a synchronous memory device comprising: a first stage for generating a first delayed clock signal responsive to a system clock, the first delayed clock signal having a first phase delay with respect to the system clock; a second stage arranged in succession with the first stage for generating a second delayed clock signal having a second phase delay with respect to the system clock; wherein each stage includes a switch arranged to provides its respective delayed clock signal as an internal clock signal to the memory device if its respective delayed clock signal is synchronized with the system clock; and wherein the first stage disables the second stage if the first delayed clock signal is synchronized with the system clock.

An advantage of the present invention is that it reduces amount of power required to generate an accurately synchronized internal clock from an external clock in a synchronous memory device.

The foregoing and other objects, features and advantages of the invention will become more readily apparent from the following detailed description of a preferred embodiment of the invention which proceeds with reference to the accompanying drawings.

DETAILED DESCRIPTION

Figure 5:
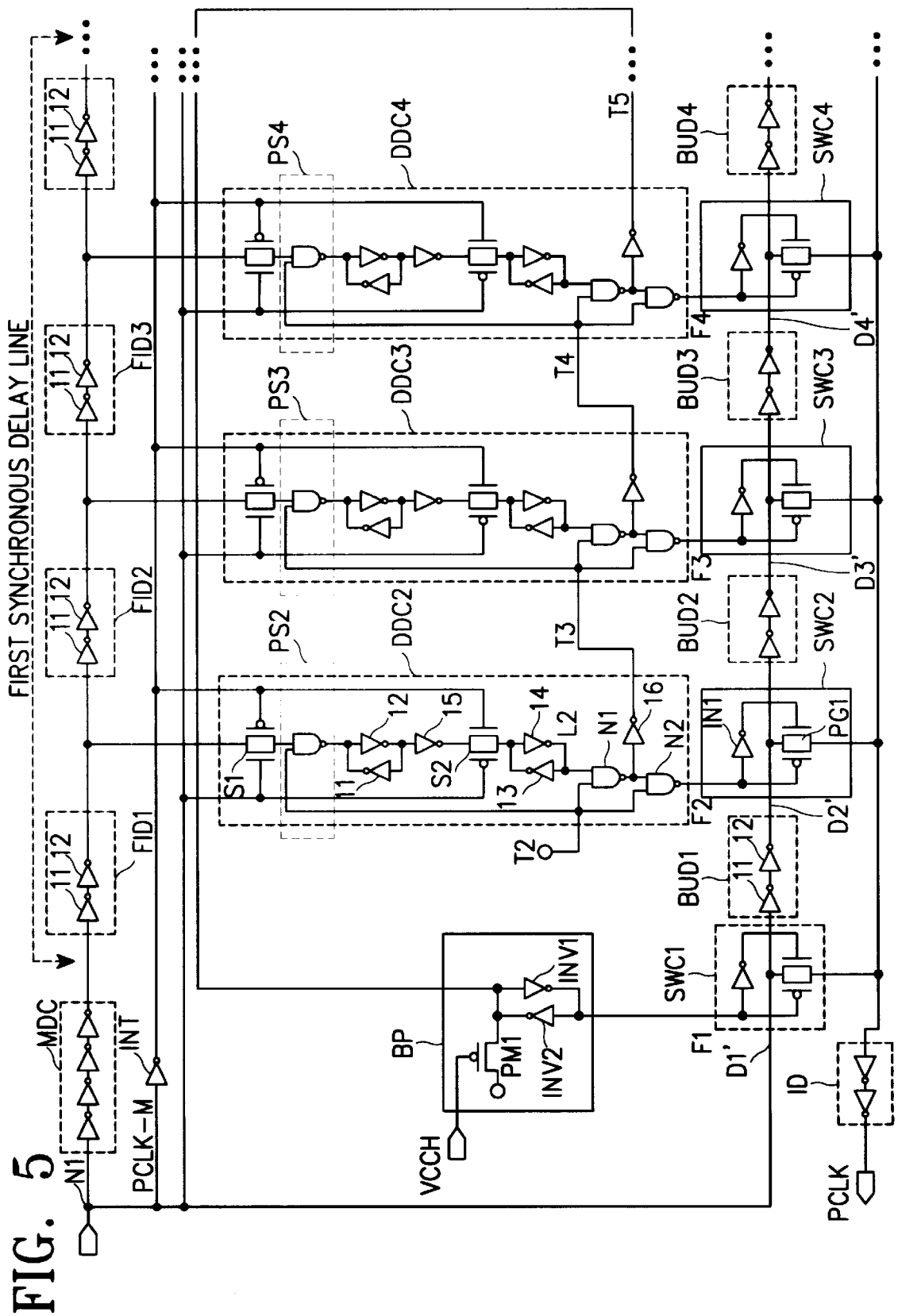
FIG. 5 is a circuit diagram of a first embodiment of a digital delay locked loop according the present invention.

FIG. 5 is a circuit diagram of a first embodiment of a digital delay locked loop according the present invention. Referring to FIG. 5, the detailed construction of unit delayers FUD1–FUDn and BUD1–BUDn, switches SWC1–SWCn, phase delay detectors DDC2–DDCn, and the mutual connection relationship therebetween is the same as those shown in FIG. 3. However, the phase delay detectors DDC2–DDCn in FIG. 5, which form a delay phase comparing detector, are different from the phase delay detectors DDC2–DDCn shown in FIG. 3 as will be explained in more detail below,.

Figure 1:
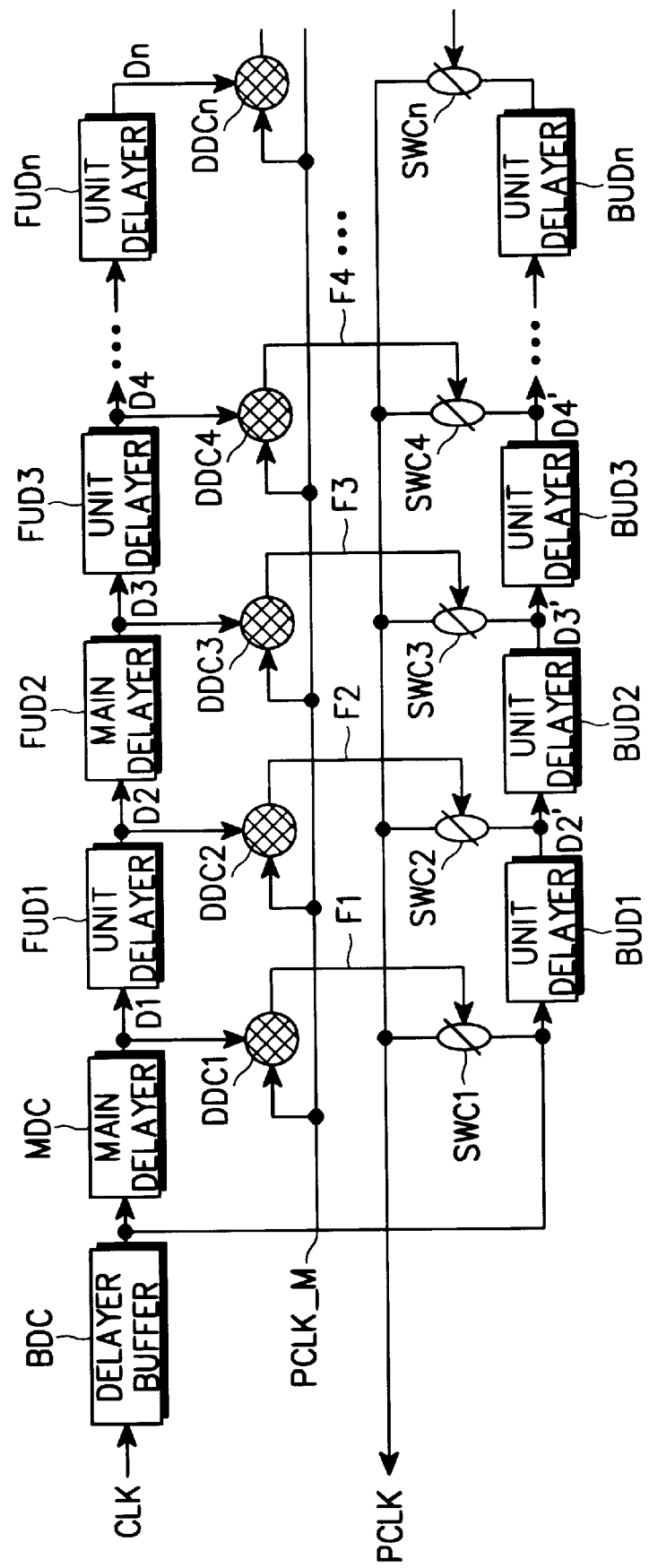
FIG. 1 is a block diagram of a prior art digital delay locked loop using a synchronous delay line.
Figure 2:
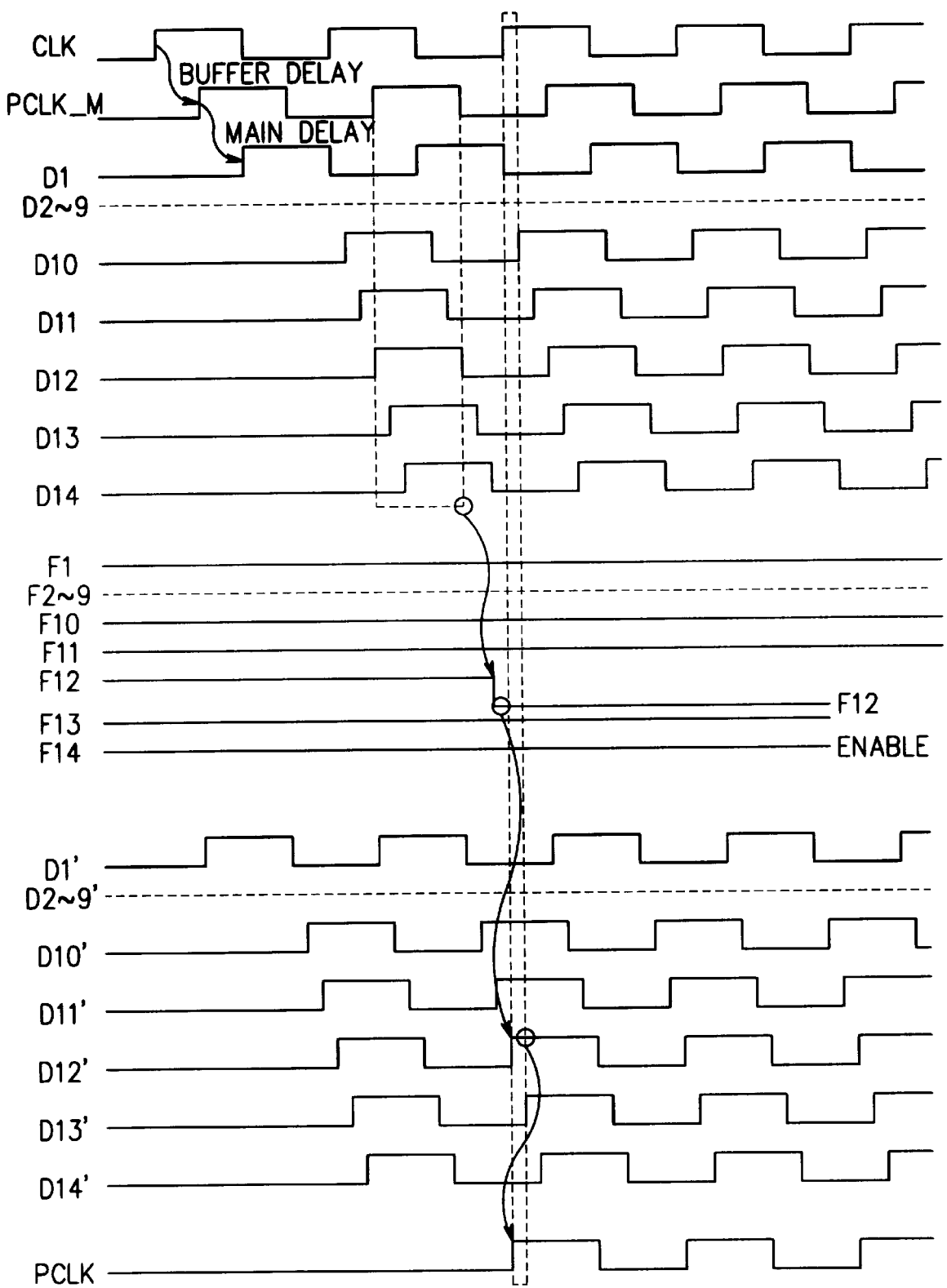
FIG. 2 is a timing chart illustrating the operation of the delay locked loop of FIG. 1.

Also, the delay buffer BDC indicated in FIG. 1 is not shown in FIG. 5, nor is the phase delay detector DDCi for receiving the second clock D1 generated from main delayer MDC. Instead of the phase delay detector DDC1, a bypass circuit BP is included in order to accommodate situations in which the synchronization through the synchronous delay line is not correct. The bypass circuit BP receives a carry output from the phase delay detector DDCn, and if the period of the external system clock CLK is longer than the delay time of the synchronous delay line, the bypass circuit BP bypasses the first clock PCLK_M directly to the internal clock PCLK by the operation of switch SWC1. An internal delayer ID having two inverters connected in series is installed to a final output stage in order to accurately detect the level and output time of the internal clock PCLK.

Each phase delay detector in FIG. 5 includes transmission switches S1 and S2 formed from a PMOS transistor and an NMOS transistor, inverters I1 and I2 which form a first latch circuit, inverters I3 and I4 which form a second latch circuit, an inverter I6, NAND gates N1 and N2, and an operation cutting circuit PS2.

After a synchronized internal clock is generated by the detecting operation of a specific phase delay detector, the operation cutting circuit PS2 cuts off the internal operation of the phase delay detectors installed in the next stage of the specific phase delay detector. Therefore, the operation cutting circuits PS2, PS3 and PS4 shown in FIG. 5 cut off the internal operation of the phase delay detectors DDC2, DDC3 and DDC4 to save power.

Each operation cutting circuit consists of a NAND gate for generating a NAND response with respect to two inputs. One input of the NAND gate of the operation cutting circuit is connected the output of the transmissions switch S1, and the other input thereof is connected to a carry input terminal Ti of the phase delay detector in the preceding stage. For example, the NAND gate of the operation cutting circuit PS3 has one input terminal connected to the carry output terminal T3 of phase delay detector DDC2. The output of the NAND gate is connected to the input of a first latch circuit consisting of the inverters I1 and I2. Therefore, if the two signals of the phase delay detector of the preceding stage are phasesynchronized, the carry output terminal is set to logic "LOW" and the output of the NAND gate of the operation cutting circuit is logic "HIGH" irrespective of the logic state of its one terminal receiving the output of the transmission switch S1, thereby fixing the input of the first latch circuit to logic "HIGH". Thus, the first latch circuit is disabled. Hence, the first latch circuit cuts off the operation of the phase delay detector that includes it. Consequently, since the internal operation of the phase delay detectors installed at the next stage of a phase-synchronized block is cut off, less current is consumed and power is saved.

Figure 6:
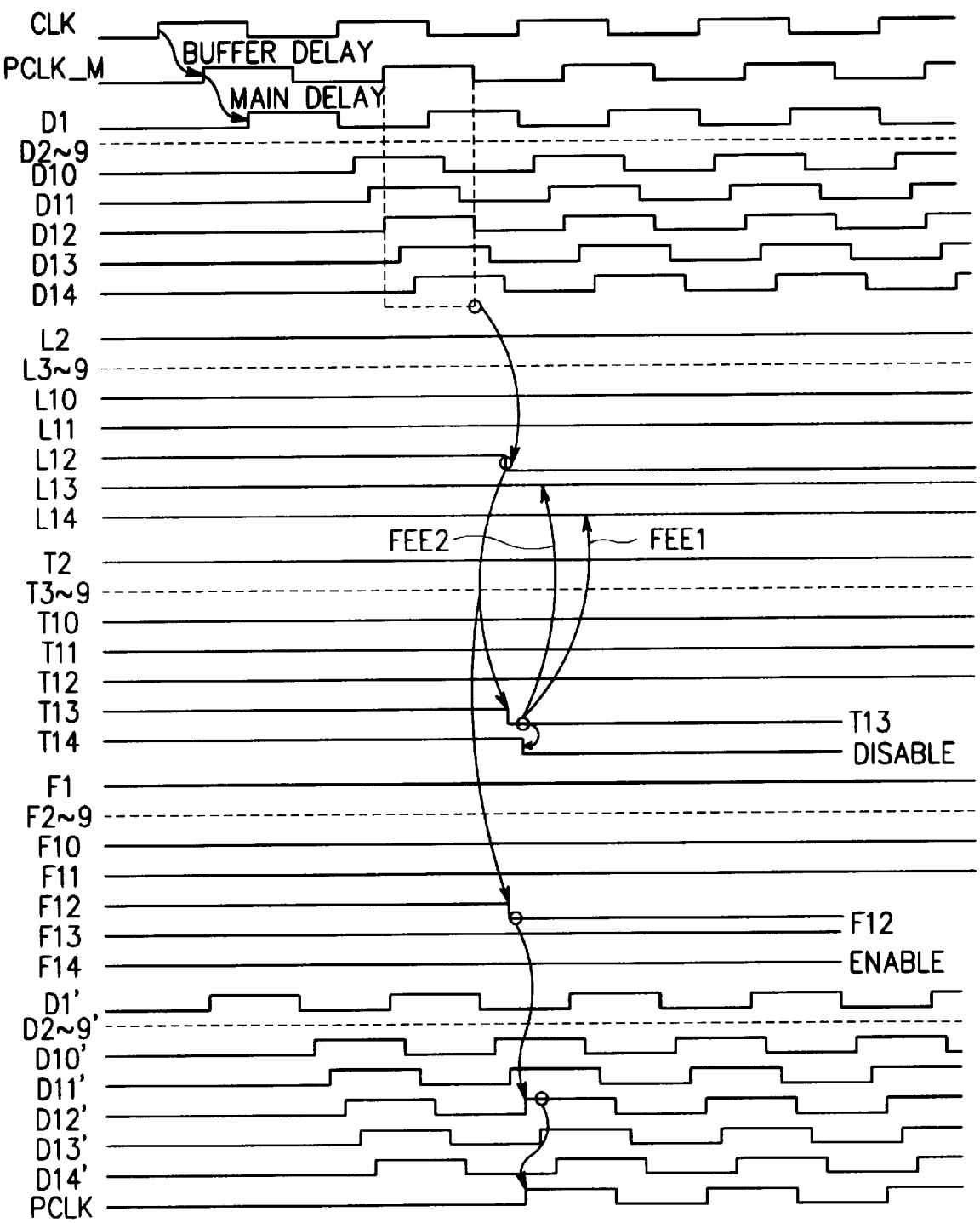
FIG. 6 is a timing chart illustrating the operation of the circuit of FIG. 5.

FIG. 6 is a timing chart showing the operation of the circuit of FIG. 5. If the external system clock CLK is delayed by the delay buffer BDC (not shown), the first clock PCLK_M appears at an input node N1. The main delay MDC delays the first clock PCLK_M by the delay length caused by four inverters and generates the second clock D1 shown in FIG. 6. The first clock PCLK_M is sequentially delayed by the serially connected unit delayers BUD1–BUDn of the second synchronous delay line, and delayed clocks D2'–Dn' are generated from the respective output nodes of the unit delayers BUD1–BUDn, as shown in FIG. 6. The delay time of one unit delayer is about 0.5 nano seconds. The delayed clocks D1'–Dn' are advanced relative to the clocks D1–Dn by the delay length of the main delayer MDC. When one of the enable signals is activated, one of the switches SWC1–SWCn is turned on, thereby selecting only one of the delayed clocks D1'–Dn' to be provided as the internal clock PCLK.

On the other hand, the second clock D1 generated from the main delayer MDC is sequentially delayed by the unit delayers FUD1–FUDn each having two inverters serially connected to each other and appears as delayed clocks D2–D14 as shown in FIG. 6. The clocks D2–Dn generated from the output nodes of the unit delays FUD1–FUDn are supplied to each input of the respective transmission switches S1 of the phase delay detectors DDC2–DDCn. Each transmission switch S1 of the phase delay detectors DDC2–DDCn is coupled by one NMOS transistor and one PMOS transistor like a typical transmission gate. The gate of the NMOS transistor of the transmission switch S1 is connected to the first clock PCLK_M, and the gate of the PMOS transistor of the transmission switch S1 is connected to the output node of an inverter INT for inverting the first clock PCLK_M. Each output node of each transmission switch S1 within the phase delay detectors DDC2–DDCn is connected to one input of each NAND gate of the operation cutting circuits PS2, PS3 and PS4. The output of the NAND gate of each operation cutting circuit is connected to the input node of the first latch circuit consisting of the inverters I1 and I2 for latching an input signal and providing the latched input signal to the input of the transmission switch S2.

If the first clock PCLK_M is logic "HIGH", the transmission switch S1 is turned on and the delayed clocks D2–Dn generated from the unit delayers FUD1–FUDn are applied to one terminal of the NAND gate of the operation cutting circuit. If the phase synchronization is not correct when the logic "HIGH" level is applied to the other input terminal of the NAND gate of the operation cutting circuit, the NAND gate inverts the phase of the delayed clocks D2–Dn supplied to its one input. In such a case, the NAND gate of the operation cutting circuit is operated as a transmission switch used for inverting the phase. Therefore, the first latch circuit latches the phase-inverted delayed clocks D2–Dn until the transmission switch S2 is turned on.

Figure 3:
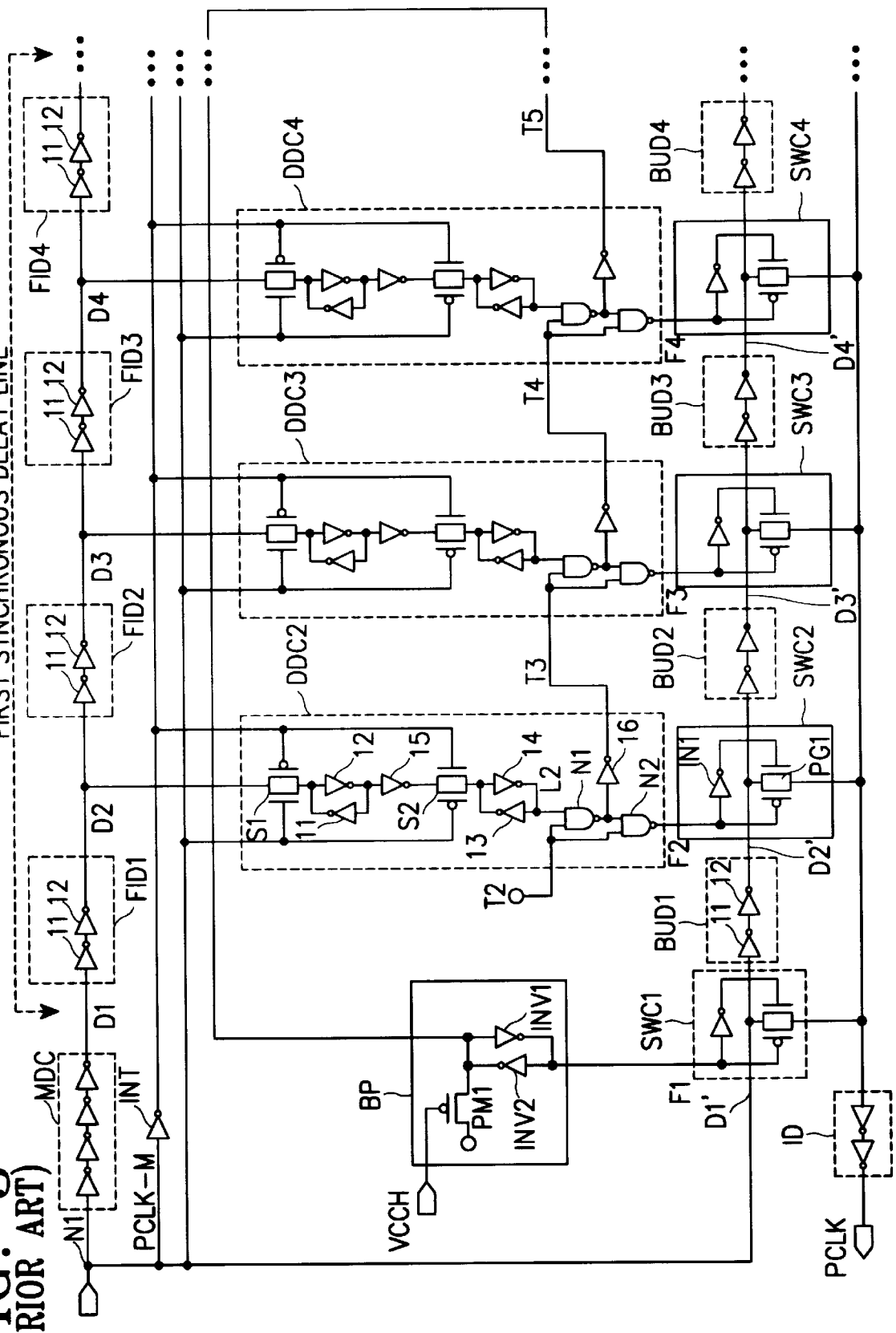
FIG. 3 is a schematic circuit diagram showing more details of the digital delay locked loop of FIG. 1.
Figure 4:
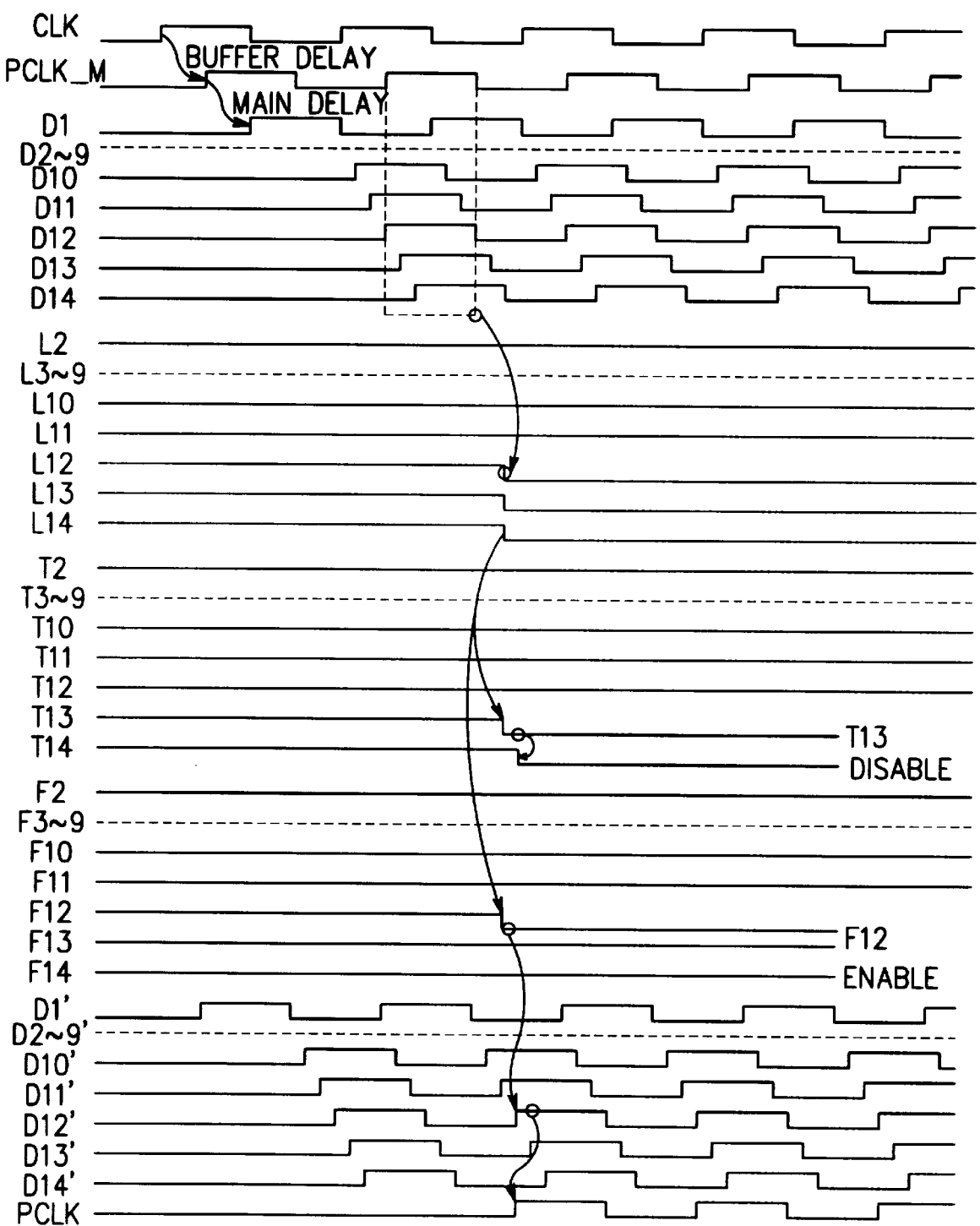
FIG. 4 is a timing chart illustrating the operation of the circuit of FIG. 3.

The latched signals are generated when the transmission switch S2 is turned on. The transmission switch S2 is connected to the output node of the first latch circuit and turned on when the first clock PCLK_M is logic "LOW". In FIG. 5, the inverter I5 which is shown in FIG. 3 is not used because the NAND gate performs the inverting operation. That is, the present invention reduces the number of components and simultaneously achieves a power saving effect. The output node of the transmission switch S2 is connected to the input of the second latch circuit consisting of the inverters I3 and I4 for latching the input clock. The output node Li of the second latch circuit is connected to one input of a carry generator consisting of the NAND gates N1 and N2 and the inverter I6.

The carry generator activates the enable signal generated to the output node Fi and simultaneously disables the carry output terminal Ti+1 only when the carry input terminal Ti and the output node Li are logic "HIGH" and "LOW" respectively. For example, if the input terminal T3 is logic "HIGH" and node L3 is logic "LOW", the output of the NAND gate N2 is logic "LOW". Since the output node F3 is logic "LOW", switch SWC3 is turned on. The carry output terminal T4 is logic "LOW" and changes to a disabled state. If logic levels that are different from the above example are applied, the output node Fi becomes logic "HIGH" and the carry output terminal Ti+1 becomes logic "HIGH". If the enable signal generated to the output node F3 is active, the first clock PCLK_M is synchronized with the delayed clock D3 without any phase delay difference.

Hereinafter, the cutting operation of the phase delay detector for saving power during phase synchronization will now be described. In FIG. 6, the delayed clock D12 of the first synchronous delay line is shown synchronized with the first clock PCLK_M. Therefore, the output node L12 of the second latch circuit generates a logic "LOW". The carry output terminal T13, as well as the next terminals are disabled to logic "LOW", and the output node F12 is enabled. Then, the delayed clock D12' from the second synchronous delay line passes through the corresponding switch and is provided as the internal clock PCLK through the internal delayer ID.

However, if the carry output terminal T13 is disabled to logic "LOW", the output node L13, as well as the next output nodes L14–Ln of the second latch circuit, are maintained to logic "HIGH" levels as indicated by arrows EFF1 and EFF2. This shows the power saving effect. If the delayed clock D12 of the first synchronous delay line is phase-synchronized with the first clock PCLK_M, the output node L12 of the second latch circuit is driven to logic "LOW", and the output nodes L13–Ln are maintained at logic "HIGH" because of the operation cutting circuit consisting of the NAND gate. That is, the carry output terminal T13 of the phase delay detector, and the second latch circuit having the output node L12 generate logic "LOW" signals according to the phase synchronization. The other terminal of the NAND gate of the operation cutting circuit within the phase delay detector including the second latch circuit having the output node L12 receives the logic "LOW" level. Therefore, the output of the NAND gate of the operation cutting circuit becomes logic "HIGH" irrespective of the logic state of one terminal of the NAND gate. The input of the first latch circuit connected to the output of the NAND gate is fixed to logic "HIGH". The first latch circuit having the input fixed to logic "HIGH" generates a logic "LOW" output, and the output of the second latch circuit, that is, the output node L13 appears as logic "HIGH". Thus, the first and second latch circuits are disabled, thereby cutting off the operation of the phase delay detector, and the internal operation of the phase delay detectors installed in the next stage of the phase-synchronized detector are cut off. Therefore, less current is consumed and a power saving effect is achieved.

A second embodiment of a delay locked loop in accordance with the present invention will now be described in detail with reference to FIG. 7. The circuit of FIG. 7 saves power by optimizing the structure of each unit delayer and thus cuts off the internal operation of certain ones of the unit delayers as well as the internal operation of the phase delay detectors.

Figure 7:
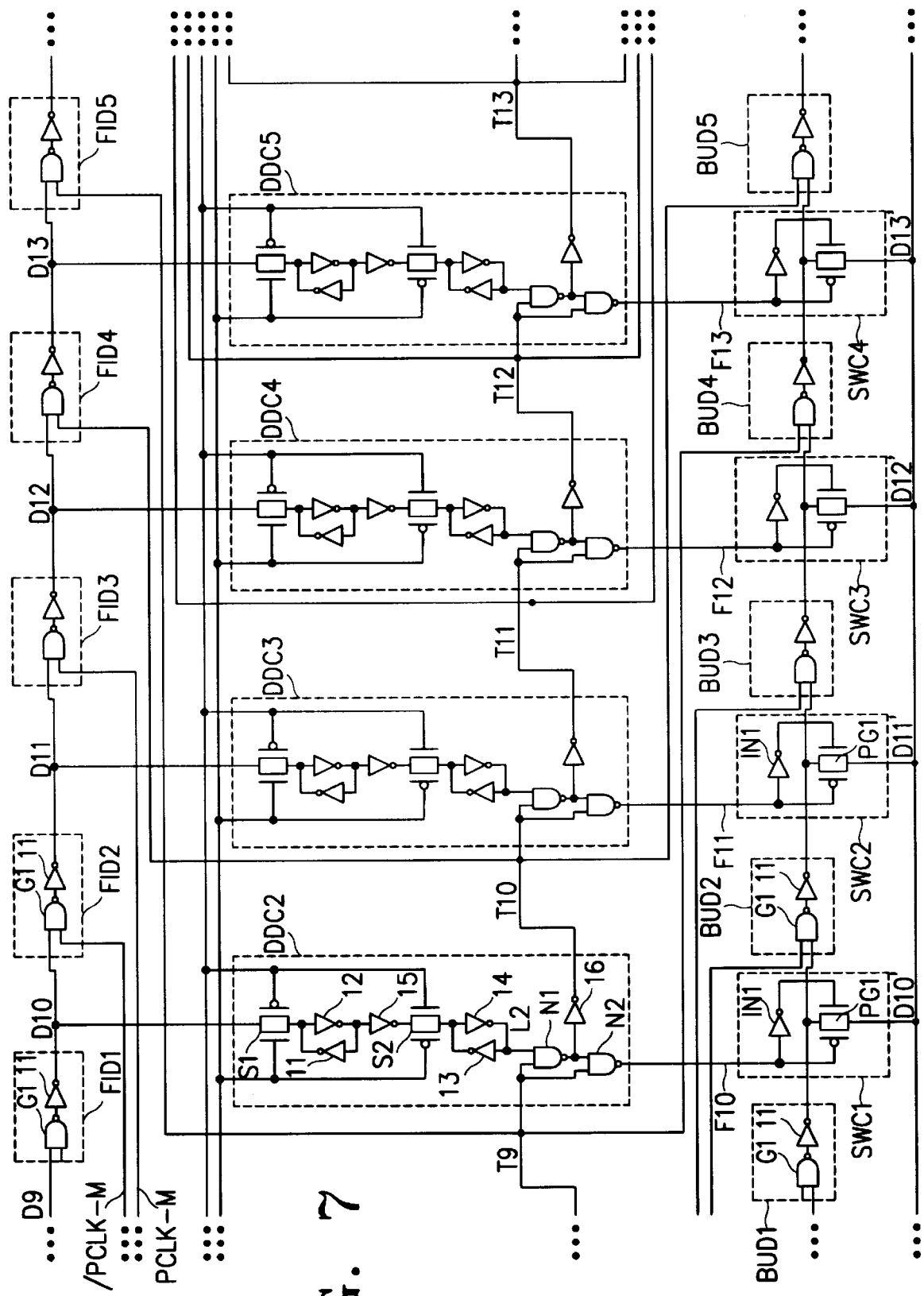
FIG. 7 is a circuit diagram of a second embodiment of a digital delay locked loop according the present invention.

In the circuit of FIG. 7, the detailed circuit construction of the switches SWC1–SWCn, the phase delay detectors DDC2–DDCn, and the mutual connection relationship therebetween is the same as indicated in FIG. 3. Each of the phase delay detectors DDC2–DDCn in FIG. 7 have the same internal construction and include transmission switches S1 and S2 formed from a PMOS transistor and an NMOS transistor, inverters I1, I2 and I5 which form a first latch circuit, inverters I3 and I4 which form a second latch circuit, an inverter I6, and NAND gates N1 and N2. However, unit delayers FUD1–FUDn and BUD1–BUDn which form first and second synchronous delay lines, respectively, are different from those shown in FIG. 3. Each unit delayer in FIG. 5 consists of a NAND gate G1 and an inverter I1 having an input connected to the output of the NAND gate G1. The first input of the NAND gate G1 is connected to the output of the preceding unit delayer. The second input of the NAND gate G1 is connected to the carry output Ti+1 of the phase delay detector correspondingly connected to the unit delayer positioned before the preceding unit delayer.

If the internally generated clock PCLK is phase-synchronized with the first clock PCLK_M, the operation of the unit delayers of the following stages is cut off by the carry output Ti+1, and the operation of the successive phase delay detectors connected to the unit delayer which is cut off is also prevented so as to reduce the power consumption. For example, if the NAND gate G1 is used in the unit delayers FUD4 and BUD4, the carry output T9 from the phase delay detector preceding phase delay detector DDC2 is applied to the second inputs of the unit delayers FUD4 and BUD4. The output of the NAND gate G1 is applied to the input of the inverter I1. Therefore, if the two signals input to the phase delay detector of the preceding stage are phase-synchronized, the carry output terminal Ti+1 is set to logic "LOW" and the output of the NAND gate G1 of the unit delayer is logic "HIGH" irrespective of the logic state of its other terminal. Hence, the input of the inverter Ii is fixed at logic "HIGH". The inverter I1 of the unit delayer having the input fixed at logic "HIGH" generates an output fixed at logic "LOW". Hence, the first latch circuit connected to the output of the transmission switch S1 does not perform any latching operations and is disabled, thereby cutting off the operation of the phase delay detector that includes it. Consequently, since the internal operation of the unit delayers and the phase delay detectors which are installed in the stages following a phase-synchronized block is cut off, current is not consumed and power saving and operating high efficiency are attained.

Figure 8:
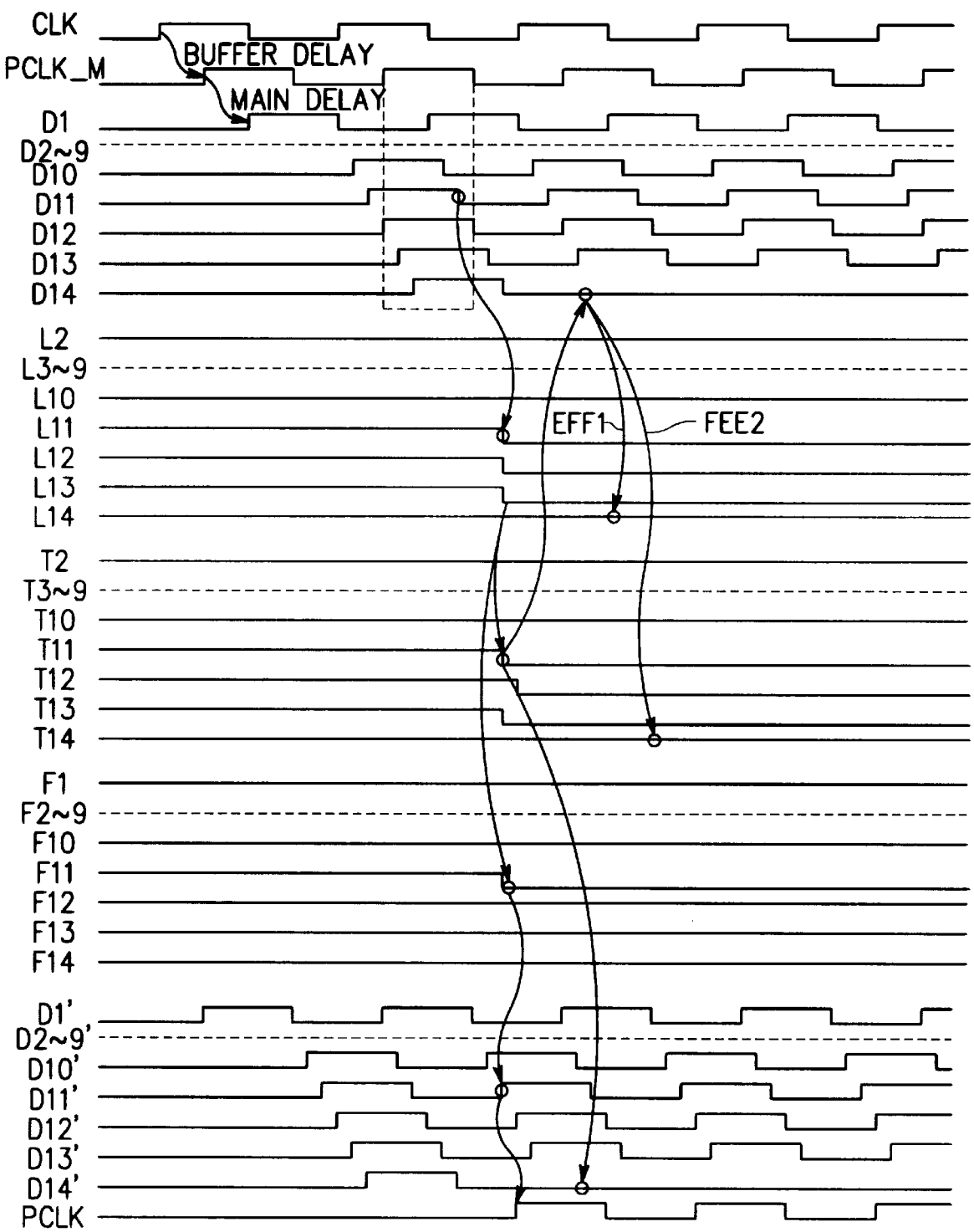
FIG. 8 is a timing chart illustrating the operation of the circuit of FIG. 7.

FIG. 8 is a timing chart that illustrates the operation of the circuit of FIG. 7. If the external system clock CLK is delayed by the delay buffer BDC (not shown), the first clock PCLK_M shown in FIG. 8 is generated. The main delay MDC (not shown) delays the first clock PCLK_M by the delay length of four inverters and generates a second clock D1 shown in FIG. 8. In this case, the first clock PCLK_M is sequentially delayed by the NAND gates and inverters of the serially connected unit delayers BUD1–BUDn of the second synchronous delay line, and delayed clocks D1'–Dn' are generated from the respective output nodes of the unit delayers BUD1–BUDn, as shown in FIG. 8. The delay time of one unit delayer is about 0.5 nano seconds. The delayed clocks D1'–Dn' are advanced relative to the clocks D1–Dn by the delay length of the main delayer MDC. When one of the enable signals F1–Fn is activated, one of the switches SWC1–SWCn is turned on, thereby selecting only one of the delayed clocks D1'–Dn' to be provided as the internal clock PCLK.

On the other hand, the second clock D1 generated from the main delayer MDC is sequentially delayed by the unit delayers FUD1–FUDn and appears as delayed clocks D2–D14 as shown in FIG. 8. The clocks D2–Dn generated at the output nodes of the unit delays FUD1–FUDn are respectively supplied to an input of the transmission switch S1 of each of the phase delay detectors DDC2–DDCn. The transmission switches S1 within the phase delay detectors DDC2–DDCn are formed from one NMOS transistor and one PMOS transistor which are coupled like a typical transmission gate. The gate of the NMOS transistor of the transmission each switch S1 is connected to the first clock PCLK_M, and the gate of the PMOS transistor of each transmission switch S1 is connected to an output node of an inverter (not shown) for inverting the first clock PCLK_M.

The output of each of the transmission switches S1 within the phase delay detectors DDC2–DDCn is connected to the input node of the first latch circuit consisting of the inverters I1, I2 and I5 for latching an input signal and providing the latched input signal to the input of the transmission switch S2. If the first clock PCLK_M is logic "HIGH", the transmission switch S1 is turned on and the delayed clocks D2–Dn generated from the unit delayers FUD1–FUDn are applied to the input of the first latch circuit. The first latch circuit latches the phase-inverted delayed clocks D2–Dn generated through the transmission switch S1 until the transmission switch S2 is turned on. The latched signals at each stage are generated when the transmission switches S2 are turned on. The transmission switch S2 is connected to the output node of the first latch circuit and turned on when the first clock PCLK_M is logic "LOW". The output node of each transmission switch S2 is connected to the input of each of a second latch circuit consisting of the inverters I3 and I4 for latching an input clock. The output node Li of the second latch circuit is connected to one input of a carry generator consisting of NAND gates N1 and N2 and inverter I6.

The carry generator activates the enable signal generated at the output node Fi and simultaneously disables the carry output terminal Ti+1 only when a carry input terminal Ti and the output node Li are logic "HIGH" and "LOW" respectively. For instance, if the input terminal T10 is logic "HIGH" and a node L11 is logic "LOW", the output of the NAND gate N2 is logic "LOW". Since the output node F11 is logic "LOW", switch SWC2 is turned on. A carry output terminal T11 is logic "LOW" (disabled state). If logic levels which are different from the above example are applied, the output node Fi becomes is disabled (logic "HIGH") and the carry output terminal Ti+1 is enabled (logic "HIGH"). If the enable signal generated at the output node F11 is active, the first clock PCLK_M is synchronized state with the delayed clock D11 without any phase delay difference therebetween.

Hereinafter, the cutting operation of the first and second synchronous delay lines for saving power during phase synchronization will now be described. Referring to FIG. 8, the delayed clock D11 of the first synchronous delay line is shown phase-synchronized with the first clock PCLK_M. Therefore, the output node L11 of the second latch circuit generates a logic "LOW" signal. The carry output terminal T11 and the following terminals are disabled to logic "LOW" and the output node F11 is enabled. Then a delayed clock D11' of the second synchronous delay line is generated as the internal clock PCLK through a corresponding switch. Therefore, if the carry output terminals T11 to T13 are disabled to logic "LOW", unit delayers for generating clocks D14 and D'14 are switched off by the internal NAND gate, and thus the output node L14 and the following output nodes L15–Ln of the second latch circuit are not set to logic "LOW" as indicated by arrows EFF1 and EFF2. This shows the power saving effect.

Therefore, if two signals input to the phase delay detector of the preceding stage are phase-synchronized, the carry output terminal Ti+1 generates a logic "LOW". Then the NAND gate G1 generates a logic "HIGH" irrespective of the logic state of its other terminal. The input of the inverter I1 is fixed to a logic "HIGH". The inverter I1 having the input fixed to a logic "HIGH" maintains its output at a logic "LOW". The first latch connected to the output of the transmission switch S1 does not perform any latching operations and is disabled, thereby cutting off the operation of the phase delay detector that includes it. The internal operation of the unit delayers and phase delay detectors which are installed at the following stages of a phase-synchronized block are also cut off. Therefore, less current is consumed and an improved power saving effect is achieved.

As described above, after the synchronized internal clock is generated by the detecting operation of a specific phase delay detector, the internal operation of the unit delayers and the phase delay detectors which are installed at the following stages of the specific phase delay detector can be cut off. Therefore, an internal clock which is accurately synchronized with the external system clock is generated, but unnecessary power consumption is prevented. As a result, the power consumption of the synchronous semiconductor memory device can be reduced.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A method for operating a digital delay locked loop for a synchronous semiconductor memory device, the delay locked loop comprising a plurality of stages arranged in successive order for generating a plurality of delayed clock signals responsive to a system clock, each stage generating one of the plurality of delayed clock signals such that the delayed clock signal from each stage has a different phase delay with respect to the system clock, the method comprising:

selecting one of the stages that has a delayed clock signal that is synchronized with the system clock;

providing the delayed clock signal from the selected stage as an internal clock; and disabling any stages that are not necessary for generating the selected delayed clock signal, thereby reducing the power consumed by the delay locked loop.

2. A method according to claim 1 wherein disabling the stages includes disabling any of the plurality of stages following the selected stage.

3. A method according to claim 1 wherein:

each stage includes a first unit delayer; and disabling the stages includes disabling the first unit delayer in each disabled stage.

4. A method according to claim 3 wherein:

each stage includes a second unit delayer; and disabling the stages includes disabling the second unit delayer in each disabled stage.

5. A method according to claim 1 wherein:

each stage includes a phase delay detector and disabling the stages includes disabling the phase delay detector in each disabled stage.

6. A digital delay locked loop for a synchronous memory device comprising:

a first stage for generating a first delayed clock signal responsive to a system clock, the first delayed clock signal having a first phase delay with respect to the system clock;

a second stage arranged in succession with the first stage for generating a second delayed clock signal having a second phase delay with respect to the system clock;

wherein each stage includes a switch arranged to provide its respective delayed clock signal as an internal clock signal to the memory device if its respective delayed clock signal is synchronized with the system clock; and wherein the first stage disables the second stage if the first delayed clock signal is synchronized with the system clock.

7. A digital delay locked loop according to claim 6 wherein:

the first stage includes a first phase detector for activating a carry signal when the first delayed clock signal is synchronized with the system clock; and the second stage includes an operation cutting circuit coupled to the first phase detector for disabling the second stage responsive to the carry signal.

8. A digital delay locked loop according to claim 7 wherein:
the second stage includes a second phase detector; and
the operation cutting circuit is included within the second phase detector for disabling the second phase detector responsive to the carry signal.

9. A digital delay locked loop according to claim 7 wherein:
the second stage includes a unit delayer for generating the second delayed clock signal responsive to the system clock; and
the operation cutting circuit is included within the unit delayer for disabling the unit delayer responsive to the carry signal.

10. A digital delay locked loop according to claim 9 wherein:
the unit delayer further includes an inverter having an input terminal; and
the operation cutting circuit includes a NAND gate having a first input terminal coupled to receive the first delayed clock signal, a second input terminal coupled to receive the carry signal, and an output terminal coupled to the input terminal of the latch.

11. A digital delay locked loop for a synchronous memory device comprising:
a first stage for generating a first delayed clock signal responsive to a system clock, the first delayed clock signal having a first phase delay with respect to the system clock; and
a second stage arranged in succession with the first stage for generating a second delayed clock signal having a second phase delay with respect to the system clock;
wherein:
each stage includes a switch arranged to provide its respective delayed clock signal as an internal clock signal to the memory device if its respective delayed clock signal is synchronized with the system clock;
the first stage disables the second stage if the first delayed clock signal is synchronized with the system clock;
the first stage includes a first phase detector for activating a carry signal when the first delayed clock signal is synchronized with the system clock;
the second stage includes an operation cutting circuit coupled to the first phase detector for disabling the second stage responsive to the carry signal;
the second stage includes a second phase detector;
the operation cutting circuit is included within the second phase detector for disabling the second phase detector responsive to the carry signal;
the operation cutting circuit includes a first input terminal, a second input terminal coupled to receive the carry signal, and an output terminal; and
the second phase detector includes:
a transmission gate having an input terminal for receiving an input signal and an output terminal coupled to the first input terminal of the operation cutting circuit, and
a latch having an input terminal coupled to the output terminal of the operation cutting circuit.

12. A digital delay locked loop according to claim 11 wherein the operation cutting circuit includes a NAND gate having a first input terminal coupled to the output terminal of the transmission gate, a second input terminal coupled to receive the carry signal, and an output terminal coupled to the input terminal of the latch.

13. A digital delay locked loop for a synchronous memory device comprising:
a first plurality of unit delayers arranged in successive order to form a first synchronous delay line for generating a first plurality of delayed clock signals responsive to an external clock signal;
a plurality of phase detectors arranged in successive order to compare the external clock signal to the plurality of delayed clock signals and generate a plurality of enable signals;
a second plurality of unit delayers arranged in successive order to form a second synchronous delay line for generating a second plurality of delayed clock signals responsive to the external clock signal; and
a plurality of switches arranged in successive order to select one of the second plurality of delayed clock signals as an internal clock signal responsive to the plurality of enable signals, each of the switches corresponding to a respective one of the phase detectors and a respective one of the second plurality of clock signals;
wherein each of the plurality of phase detectors disables the next successive phase detector if the corresponding one of the second plurality of clock signals is synchronized with the external clock signal.

14. A digital delay locked loop according to claim 13 wherein:
each of the plurality of phase detectors activates one of a plurality of carry signals when the corresponding one of the second plurality of clock signals is synchronized with the external clock signal; and
each of the plurality of phase detectors includes an operation cutting circuit arranged to disable the phase detector responsive to one of the carry signals.

* * * * *

UNITED STATES PATENT AND TRADEMARK OFFICE
CERTIFICATE OF CORRECTION

PATENT NO. : 6,222,894 B1
DATED : April 24, 2001
INVENTOR(S) : Lee

It is certified that error appears in the above-identified patent and that said Letters Patent is hereby corrected as shown below:

Column 3,
Line 15, "FUDD1-FUDn" should read -- FUD1-FUDn --,

Column 6,
Line 66, "DDCi" should read -- DDC1 --.

Column 10,
Line 17, "inverter Ii" should read -- inverter I1 --.

Signed and Sealed this

Twenty-sixth Day of November, 2002

Attest:

Attesting Officer

JAMES E. ROGAN
*Director of the United States Patent and Trademark Office*